US009515132B2

(12) United States Patent
Sato et al.

(10) Patent No.: US 9,515,132 B2
(45) Date of Patent: *Dec. 6, 2016

(54) ORGANIC ELECTROLUMINESCENT DISPLAY DEVICE AND METHOD OF MANUFACTURING THE SAME

(71) Applicant: Japan Display Inc., Tokyo (JP)

(72) Inventors: Toshihiro Sato, Tokyo (JP); Hironori Toyoda, Tokyo (JP); Takeshi Ookawara, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/073,857

(22) Filed: Mar. 18, 2016

(65) Prior Publication Data

US 2016/0204187 A1 Jul. 14, 2016

Related U.S. Application Data

(63) Continuation of application No. 14/480,854, filed on Sep. 9, 2014, now Pat. No. 9,324,947.

(30) Foreign Application Priority Data

Sep. 9, 2013 (JP) ................. 2013-186146
Sep. 9, 2013 (JP) ................. 2013-186175

(51) Int. Cl.
*H01L 27/32* (2006.01)
*H01L 51/00* (2006.01)
*H01L 51/52* (2006.01)

(52) U.S. Cl.
CPC ....... *H01L 27/3279* (2013.01); *H01L 51/0015* (2013.01); *H01L 51/5243* (2013.01);
(Continued)

(58) Field of Classification Search
CPC .............. G09G 2320/0233; G09G 2300/0417; G09G 2300/0809; G09G 2320/02; H01L 27/3246; H01L 51/5284; H01L 51/56; H01L 27/326; H01L 2251/558; H01L 27/3279; H01L 51/5262
See application file for complete search history.

(56) References Cited

U.S. PATENT DOCUMENTS

2006/0097263 A1 5/2006 Lee et al.
2006/0244368 A1 11/2006 Nagayama et al.
(Continued)

FOREIGN PATENT DOCUMENTS

JP 2006-140145 A 6/2006
JP 2009-088320 A 4/2009
(Continued)

OTHER PUBLICATIONS

Korean Office Action for corresponding KR Patent Application No. 10-2014-0116718, dated Feb. 1, 2016.
(Continued)

*Primary Examiner* — Roy Potter
*Assistant Examiner* — Paul Patton
(74) *Attorney, Agent, or Firm* — Typha IP LLC

(57) ABSTRACT

A substrate on which a plurality of pixel electrodes are disposed is prepared. An organic electroluminescent film 22 is formed with the inclusion of a common layer that continuously covers the plural pixel electrodes. A common electrode is formed on the organic electroluminescent film. The common layer is irradiated with an energy ray above areas between the respective adjacent pixel electrodes with the avoidance of irradiation above the plural pixel electrodes. An electric conductivity of the common layer is reduced above the areas between the respective adjacent pixel electrodes, by irradiation of the energy ray. With this
(Continued)

configuration, a current leakage can be prevented between the adjacent pixels.

14 Claims, 18 Drawing Sheets

(52) U.S. Cl.
 CPC ........ *H01L 27/322* (2013.01); *H01L 27/3246* (2013.01); *H01L 2227/323* (2013.01)

(56) References Cited

U.S. PATENT DOCUMENTS

2012/0146031 A1* 6/2012 Lee .................... H01L 27/3265
 257/59
2014/0167018 A1* 6/2014 Okumoto et al. .. H01L 27/3244
 257/40

FOREIGN PATENT DOCUMENTS

| JP | 2009-533809 A | 9/2009 |
| JP | 2013-034143 A | 2/2010 |
| JP | 2010-212177 A | 9/2010 |
| JP | 2013-026394 A | 2/2013 |
| KR | 10-2004-0039789 A | 5/2004 |
| WO | 2010/109877 A1 | 9/2010 |

OTHER PUBLICATIONS

Korean Office Action mailed Aug. 1, 2016 for corresponding Korean Patent Application No. 10-2014-0116718.

* cited by examiner

ORGANIC ELECTROLUMINESCENT DISPLAY DEVICE AND METHOD OF MANUFACTURING THE SAME

CROSS-REFERENCE TO RELATED APPLICATION

This application is a continuation of U.S. patent application Ser. No. 14/480,854, filed on Sep. 9, 2014. Further, this application claims priorities from Japanese Application JP2013-186146 filed on Sep. 9, 2013, and Japanese application JP2013-186175 filed on Sep. 9, 2013, the contents of which are hereby incorporated by reference into this application.

BACKGROUND OF THE INVENTION

1. Field of the Invention

The present invention relates to an organic electroluminescent display device and a method of manufacturing the display device.

2. Description of the Related Art

An organic electroluminescent display device has a structure in which an organic film is sandwiched between an anode and a cathode. Normally, plural organic films are laminated on each other, and include a light emitting layer as one layer. In order to obtain light emission of one color (for example, white) in plural pixels, the organic film forming the light emitting layer is wholly continuously disposed. Alternatively, in order to obtain light emission of plural colors in the plural pixels, the organic film forming the light emitting layer is separated for each of the pixels, but the organic film forming a hole injection layer, an electron injection layer, a hole transport layer, or an electron transport layer is continuously disposed. Even in any case, at least one organic film is continuously disposed over the adjacent pixels.

SUMMARY OF THE INVENTION

In the display device of high quality, the adjacent pixels come closer to each other with the miniaturization of the pixels. For that reason, a current may leak from an electrode of any pixel to adjacent pixels through the continuous organic film. There arises such a problem that the current leakage causes the adjacent pixels to emit light.

JP 2009-88320 A discloses a method of preventing a current leakage. However, the method relates to the prevention of a current leakage between an anode and a cathode in one pixel, which is different from, a problem to be solved by the present invention. Also, JP 2010-212177 A and JP 2006-140145 A disclose that a surface of a partition (or an insulating film) is roughened, but fail to disclose an organic film formed on the partition. Therefore, there is no solution to the problem on the current leakage.

An object of the present invention is to prevent a current leakage between the adjacent pixels.

(1) According to the present invention, there is provided a method of manufacturing an organic electroluminescent display device, including the steps of: preparing a substrate on which a plurality of pixel electrodes are disposed; forming an organic electroluminescent film with the inclusion of a common layer that continuously covers the plurality of pixel electrodes; forming a common electrode on the organic electroluminescent film; and irradiating the common layer with an energy ray above areas between the respective adjacent pixel electrodes with the avoidance of irradiation above the organic electroluminescent film, in which an electric conductivity of the common layer is reduced above the areas between the respective adjacent pixel electrodes, by irradiation of the energy ray. According to the present invention, since the electric conductivity of the common layer of the organic electroluminescent film becomes lower above the areas between the respective adjacent pixel electrodes, the current leakage between the adjacent pixels can be prevented.

(2) The method of manufacturing an organic electroluminescent display device according to the item (1), may further include the step of: forming an insulating layer in the areas between the respective adjacent pixel electrodes so as to rest on ends of the respective pixel electrodes, in which the organic electroluminescent film may be formed to rest on the insulating layer.

(3) In the method of manufacturing an organic electroluminescent display device according to the item (1) or (2), the common layer may be irradiated with the energy ray before forming the common electrode.

(4) In the method of manufacturing an organic electroluminescent display device according to the item (1) or (2), the energy ray may be allowed to pass through the common electrode, and applied to the common layer after forming the common electrode.

(5) The method of manufacturing an organic electroluminescent display device according to the item (1) or (2) may further include the step of forming a sealing film on the common electrode, in which the energy ray may be allowed to pass through the sealing film and the common electrode, and applied to the common layer after forming the sealing film.

(6) In the method of manufacturing an organic electroluminescent display device according to any one of the items (1) to (5), the energy ray may be applied through a mask, and the mask may have a pattern that allows the energy ray to pass above the areas between the respective adjacent pixel electrodes with the avoidance of the energy ray from passing therethrough above the plurality of pixel electrodes.

(7) The method of manufacturing an organic electroluminescent display device according to any one of the items (1) to (5) may further include the step of forming a mask layer that prevents the energy ray from passing therethrough above the organic electroluminescent film, in which the energy ray may be applied through a pattern of the mask layer, and the pattern of the mask layer may allow the energy ray to pass above the areas between the respective adjacent pixel electrodes with the avoidance of the energy ray from passing there through above the plurality of pixel electrodes.

(8) According to the present invention, there is provided an organic electroluminescent display device, including: a substrate; a plurality of pixel electrodes that are disposed on the substrate; an organic electroluminescent film that is disposed on the substrate with the inclusion of a common layer which continuously covers the plurality of pixel electrodes; and a common electrode that is disposed on the organic electroluminescent film, in which the common layer has low conductive portions lower in electric conductivity than portions above the plurality of pixel electrodes, above the areas between the respective adjacent pixel electrodes. According to the present invention, since the common layer of the organic electroluminescent film is lower in electric conductivity above the areas between the respective adjacent pixel electrodes, the current leakage between the adjacent pixel electrodes can be prevented.

(9) According to the present invention, there is provided an organic electro luminescent display device, including: a substrate; a plurality of pixel electrodes that are disposed on the substrate; an insulating layer that is disposed in areas between the respective adjacent pixel electrodes so as to rest on ends of the respective pixel electrodes; an organic electroluminescent film that is disposed on the substrate with the inclusion of a common layer which continuously covers the plurality of pixel electrodes, and the insulating layer; and a common electrode that is disposed over the organic electroluminescent film, in which the insulating layer has an upper surface with a concavo-convex shape having a plurality of concave portions and a plurality of convex portions, in which the common layer includes an upper portion that rests on the respective convex portions of the concavo-convex shape, and a lower portion that rests on the respective concave portions thereof, and in which the upper portion and the lower portion are offset vertically from each other, and at least parts of the upper portion and the lower portion in a thickness direction are discontinuous, from each other, and a thickness of the common layer is partially thinned to increase an electric resistance. According to the present invention, the thickness of the common layer is partially thinned to increase the electric resistance above the areas between the respective adjacent pixel electrodes. With the above configuration, a current can be prevented from passing through the common layer, and being leaked between the adjacent pixel electrodes.

(10) In the organic electroluminescent display device according to the item (9), the respective parts of the upper portion and the lower portion in the thickness direction may be continuous to each other.

(11) In the organic electroluminescent display device according to the item (9), the upper portion and the lower portion may be separated from each other.

(12) In the organic electroluminescent display device according to any one of the items (9) to (11), bottom surfaces of the plurality of concave portions may be arrayed along one plane, and upper surfaces of the plurality of convex portions may be arrayed along another plane.

(13) In the organic electroluminescent display device according to any one of the items (9) to (11), bottom surfaces of the plurality of concave portions may be arrayed along one convex curve, and upper surfaces of the plurality of convex portions may be arrayed along another convex curve.

(14) In the organic electroluminescent display device according to any one of the items (9) to (13), the plurality of pixel electrodes may be arrayed in a longitudinal direction and a lateral direction, a planar shape of the respective pixel electrodes may be elongated in one direction with a long axis and a short axis, respective short sides along the short axis may be adjacent to each other in the pixel electrodes adjacent to each other in the longitudinal direction, respective long sides along the long axis may be adjacent to each other in the pixel electrodes adjacent to each other in the lateral direction, and the plurality of concave portions and the plurality of convex portions in the insulating layer may be formed in areas between the adjacent long-sides with the avoidance of areas between the adjacent short sides.

(15) According to the present invention, there is provided a method of manufacturing an organic electroluminescent display device, including the steps of: preparing a substrate on which a plurality of pixel electrodes are disposed; forming an insulating layer in areas between the respective adjacent pixel electrodes so as to rest on ends of the respective pixel electrodes; forming an organic electroluminescent film on the substrate with the inclusion of a common layer that continuously covers the plurality of pixel electrodes and the insulating layer; and forming a common electrode on the organic electroluminescent film, in which the insulating layer has an upper surface with a concavo-convex shape having a plurality of concave portions and a plurality of convex portions, in which the common layer includes an upper portion that rests on the respective convex portions of the concavo-convex, shape, and a lower portion that rests on the respective concave portions thereof, and in which the upper portion and the lower portion are offset vertically from each other, and at least parts of the upper potion and the lower portion in a thickness direction are discontinuous from each other, and a thickness of the common layer is partially thinned to increase an electric resistance. According to the present invention, the thickness of the common layer is partially thinned above the areas between the respective adjacent pixel electrodes to increase the electric resistance. With the above configuration, a current can be prevented from passing through the common layer, and being leaked between the adjacent pixel electrodes.

(16) In the method of manufacturing an organic electroluminescent display device according to the item (15), the step of forming the insulating layer having the upper surface with the concavo-convex shape may include the steps of: providing an insulating material; and giving the concavo-convex shape to the insulating material by nanoimprint.

(17) In the method of manufacturing an organic electroluminescent display device according to the item (16), the step of forming the insulating layer having the upper surface with the concavo-convex shape may include the steps of: providing the insulating material to cover the plurality of pixel electrodes; and partially removing the insulating material from above at least a center portion of the respective pixel electrodes after the step of giving the concavo-convex shape.

(18) In the method of manufacturing an organic electroluminescent display device according to the item (17), the step of partially removing the insulating material may be conducted by at least one of photolithography and dry etching.

(19) In the method of manufacturing an organic electroluminescent display device according to the item (17), the insulating material may be recessed and thinned, by the nanoimprint, above at least the center portion of the respective pixel electrodes in the step of giving the concavo-convex shape.

(20) In the method of manufacturing an organic electroluminescent display device according to the item (19), the step of partially removing the insulating material may be conducted by dry etching.

DETAILED DESCRIPTION OF THE INVENTION

Figure 1:
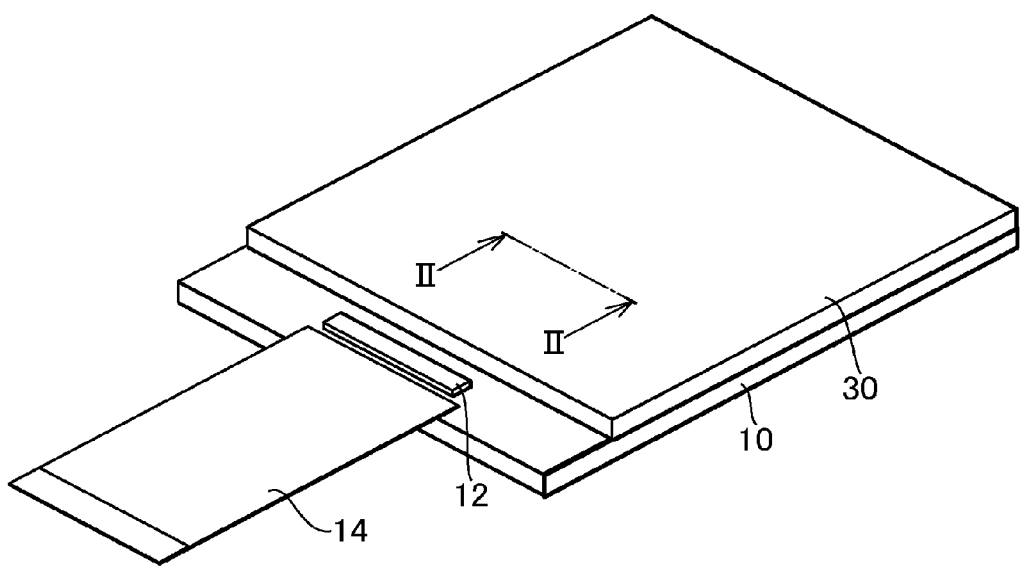
FIG. 1 is a perspective view of an organic electroluminescent display device according to a first embodiment of the present invention.
Figure 2:
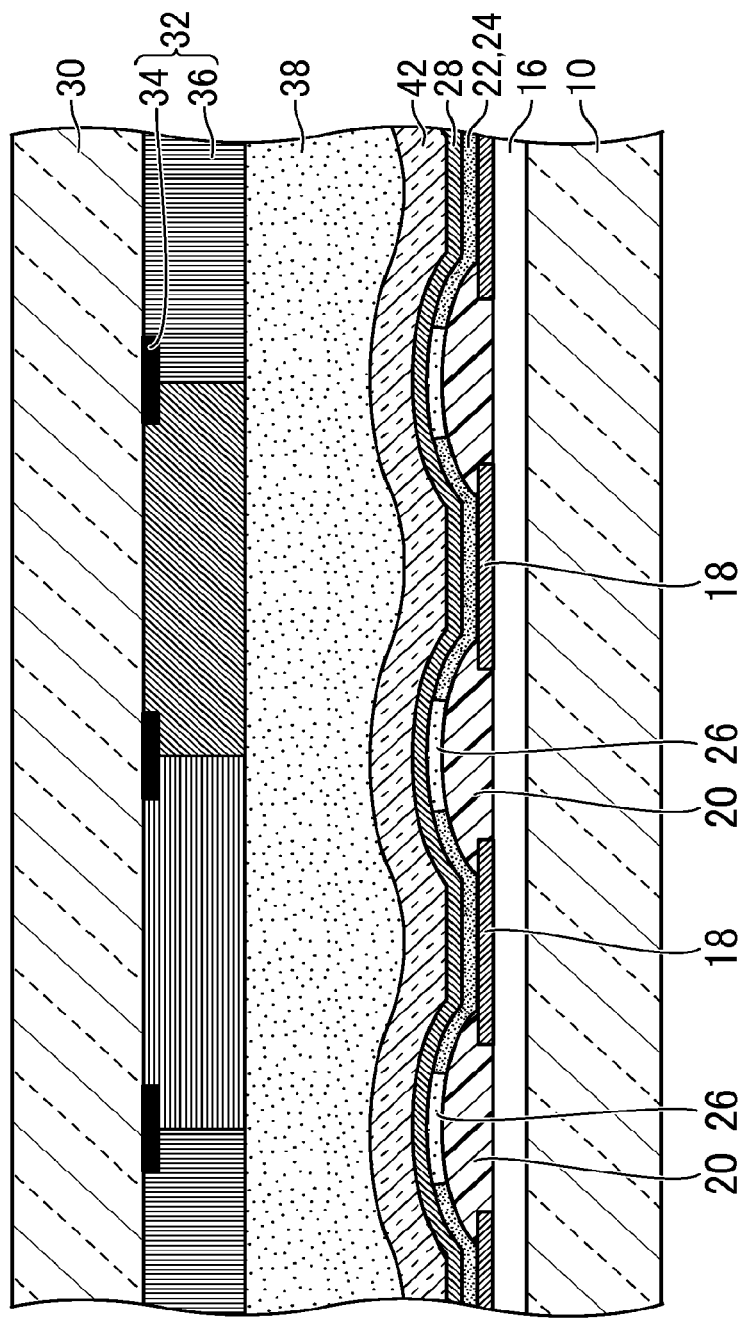
FIG. 2 is a schematic cross-sectional view taken along a line II-II of the organic electroluminescent display device illustrated in FIG. 1.

Hereinafter embodiments of the present invention will be described with reference to the accompanying drawings. FIG. 1 is a perspective view of an organic electroluminescent display device according to a first embodiment of the present invention. FIG. 2 is a schematic cross-sectional view taken along a line II-II of the organic electroluminescent display device illustrated in FIG. 1.

As illustrated in FIG. 1, the organic electroluminescent display device includes a first substrate 10 having an optical transparency made of glass or the like. The first substrate 10 has an image display area for image display. An integrated circuit chip 12 for driving an element for displaying an image is mounted on the first substrate 10. A flexible wiring substrate 14 is connected to the first substrate 10 for electric connection with an external.

As illustrated in FIG. 2, a circuit layer 16 is disposed on the first substrate 10. The circuit layer 16 includes lines, thin film transistors, and an insulating film not shown. Plural pixel electrodes 18 are disposed on the first substrate 10 (on the circuit layer 16 in the example of FIG. 2). The pixel electrodes 18 are anodes. An insulating layer 20 is disposed in areas between the respective adjacent pixel electrodes 18 so as to rest on ends of the respective pixel electrodes 18. The insulating layer 20 is configured to surround peripheral portions of the respective pixel electrodes 18.

An organic electroluminescent film 22 is disposed over the first substrate 10. The organic electroluminescent film 22 is configured to rest on the plural pixel electrodes 18 and the insulating layer 20. The organic electroluminescent film 22 is formed of plural layers although not shown, includes at least, a light emitting layer, and also includes at least one layer of an electron transport layer, a hole transport layer, an electron injection layer, and a hole injection layer. The light emitting layer is configured to emit only light of one color (for example, white).

The organic electroluminescent film 22 includes a common layer 24 that continuously covers the plural pixel electrodes 18. In the example of FIG. 2, the overall organic electroluminescent film 22 is formed of the common layer 24. Alternatively, at least one layer (except for at least one layer) of the organic electroluminescent film 22 including the plural layers is the common layer 24 (for example, the electron injection layer), and the remaining layers including at least one layer may be cut for each of the pixel electrodes 18. In the organic electroluminescent film with a tandem structure including two or more light emitting layers, a charge generation layer for supplying electrons and holes which is arranged between the respective adjacent light emitting layers may be configured by the common layer.

The common layer 24 has low conductive portions 26 lower in electric conductivity than portions above the plural pixel electrodes 18, above the areas between the respective adjacent pixel electrodes 18. The provision of the low conductive portions 26 makes it difficult that carriers (electrons or holes) flow in a spread direction of the common layer 24. Since the low conductive portions 26 are disposed over the insulating layer 20, the carriers are prevented from flowing in the spread direction of the common layer 24 above the insulating layer 20. On the contrary, in portions of the common layer 24 above the plural pixel electrodes 18 (portions except for the low conductive portions 26), a current flows in the thickness direction and the spread direction of the common layer 24.

A common electrode 28 is disposed on the organic electroluminescent film 22. The common electrode 28 is a cathode. A voltage is applied to the pixel electrodes 18 and the common electrode 28 to inject holes and electrons into the organic electroluminescent film 22 from the pixel electrodes 18 and the common electrode 28. The injected holes and electrons are coupled with each other in the light emitting layer to emit light. Since the insulating layer 20 is interposed between the ends of the respective pixel electrodes 18 and the common electrode 28, short-circuiting is prevented between the respective pixel electrodes 18 and the common electrode 28.

According to this embodiment, since the common layer 24 of the organic electroluminescent film 22 is lower in the electric conductivity above the areas between the respective pixel electrodes 18, the current leakage can be prevented between the adjacent pixels. Therefore, pixels adjacent to a pixel into which a current flows emit no light.

A sealing film 42 is disposed on the common electrode 28. The sealing film 42 seals the organic electroluminescent film 22 so as to block moisture. A filter layer 38 is disposed on the sealing film 42.

A second substrate 30 is arranged to face the first substrate 10 with a gap. A color filter layer 32 is disposed on a surface of the second substrate 30 on the first substrate 10 side. The color filter layer 32 includes a black matrix 34 and a colored layer 36. Since the light emitting layer (not shown) of the above-mentioned organic electroluminescent film 22 emits a single color (for example, white), the provision of the color filter layer 32 enables full color display in this embodiment. When the organic electroluminescent film 22 includes plural light emitting layers that emit respective different colors (for example, red, green, and blue), the light emitting layer emits the light of plural colors, thereby making the colored layer 36 unnecessary. The filter layer 38 is disposed, between the first substrate 10 and the second substrate 30.

Figure 3:
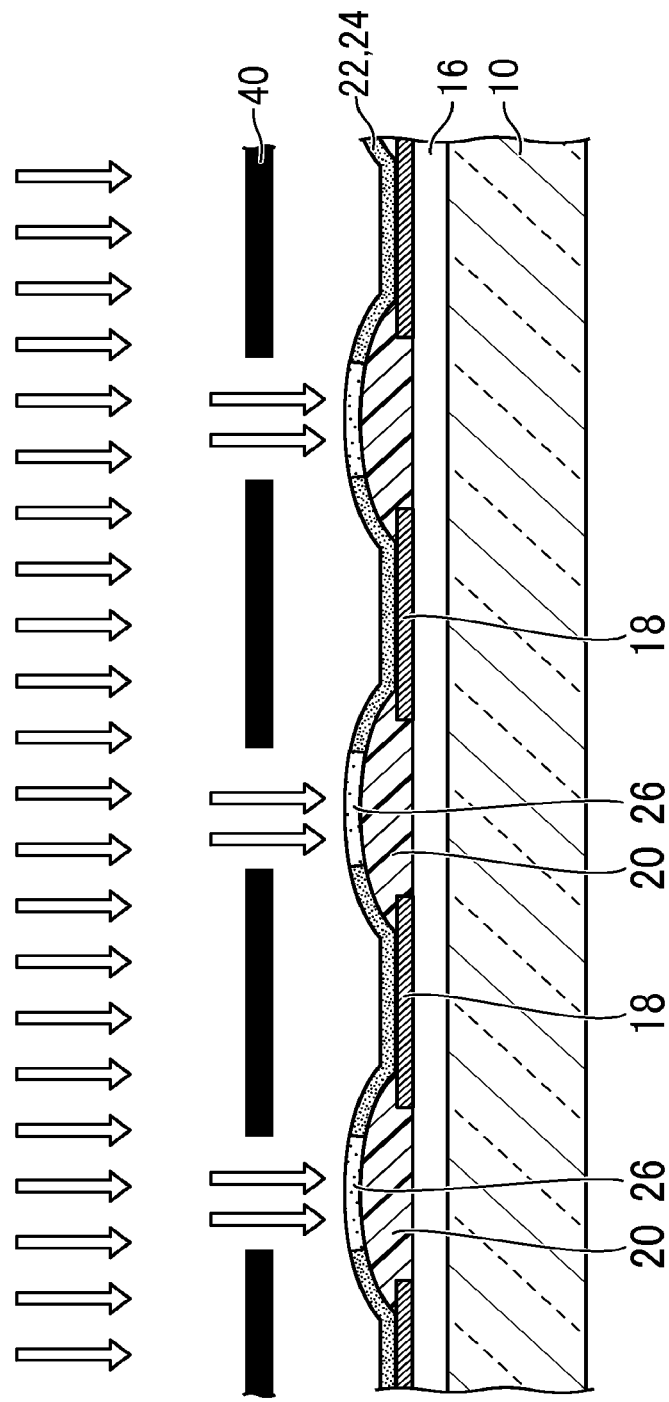
FIG. 3 is a diagram illustrating a method of manufacturing the organic electroluminescent display device according to the first embodiment.

FIG. 3 is a diagram illustrating a method of manufacturing the organic electroluminescent display device according to the first embodiment of the present, invention.

In this embodiment, the first substrate 10 on which the plural pixel electrodes 18 are disposed is prepared. The insulating layer 20 is formed in the areas between the respective adjacent pixel electrodes 18 so as to rest on the ends of the respective pixel electrodes 18. The organic electroluminescent film 22 is formed with the inclusion of the common layer 24 that continuously covers the plural pixel electrodes 18. The organic electroluminescent film 22 is formed to rest, on the insulating layer 20. The organic electroluminescent film 22 is formed by vapor deposition or sputtering.

Then, the common layer 24 is irradiated with an energy ray (ultraviolet ray, electron ray, infrared ray, etc.). The energy-ray is applied above the areas (insulating layer 20) between the respective adjacent pixel electrodes 18 with the avoidance of upsides of the plural pixel electrodes 18. With the irradiation of the energy ray, the electric conductivity of the common layer 24 is reduced above the areas between the respective adjacent pixel electrodes 18. As a result, the low conductive portions 26 are formed in the common layer 24.

The energy ray is applied through a mask 40. The mask. 40 has a pattern having ribs and openings. The pattern prevents the energy ray energy ray from passing therethrough above the plural pixel electrodes 18, and allows the energy ray to pass above the areas between the respective adjacent pixel electrodes 18. Alternatively, the mask 40 is unnecessary if laser scanning using a laser beam is applied.

Subsequently, as illustrated in FIG. 2, the common electrode 28 is formed on the organic electroluminescent film 22. The common electrode 28 is formed after the common layer 24 has been irradiated with the energy ray. Since the energy ray is applied before the formation of the common electrode 28, a loss of irradiation energy is low.

According to this embodiment, since the common layer 24 of the organic electroluminescent film 22 becomes low in the electric conductivity above the areas between the respective adjacent pixel electrodes 18, the current leakage can be prevented between the respective adjacent pixels.

Figure 4:
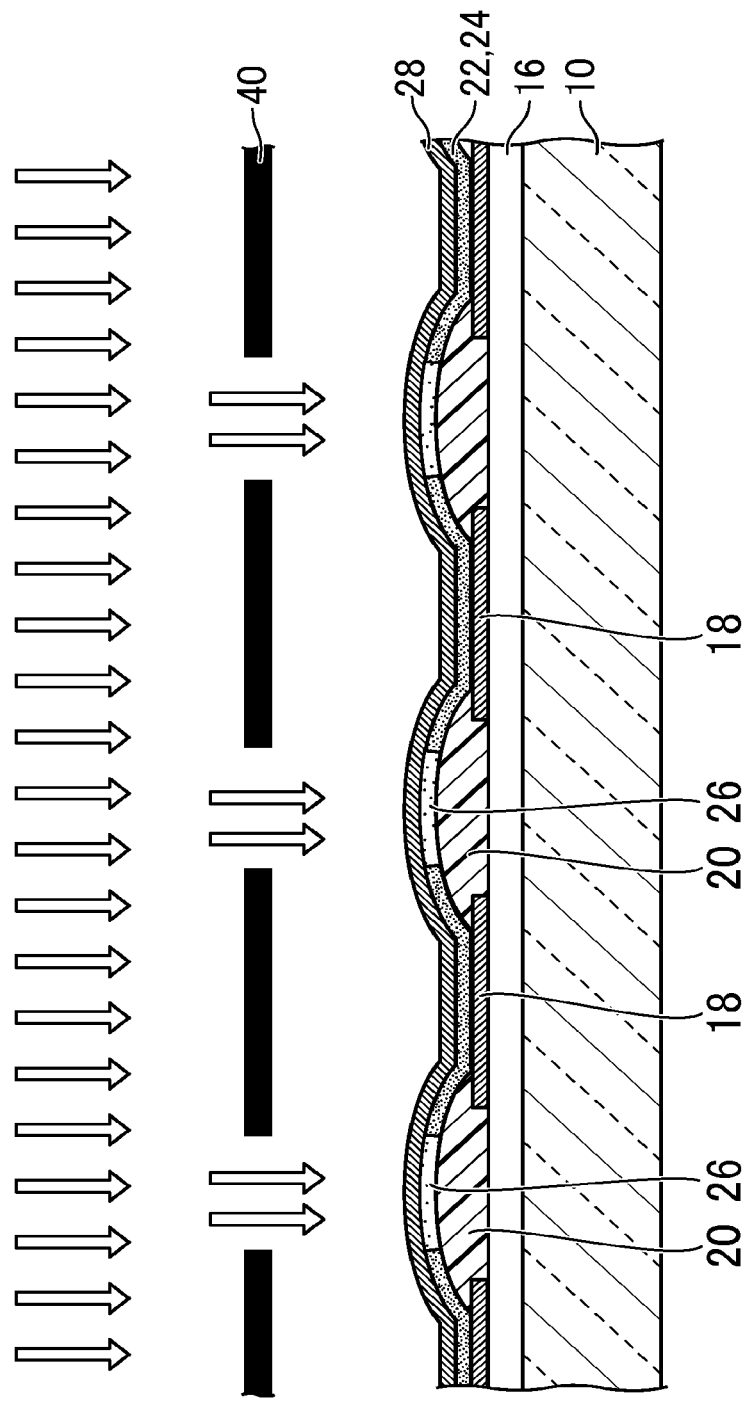
FIG. 4 is a diagram illustrating a method of manufacturing an organic electroluminescent display device according to a modification 1 of the first embodiment.

FIG. 4 is a diagram illustrating a method of manufacturing an organic electroluminescent display device according to a modification 1 of the first embodiment of the present invention. In this example, the common layer 24 is irradiated with the energy ray after the common electrode 28 has been formed. The energy ray is allowed to pass through the common electrode 28.

Figure 5:
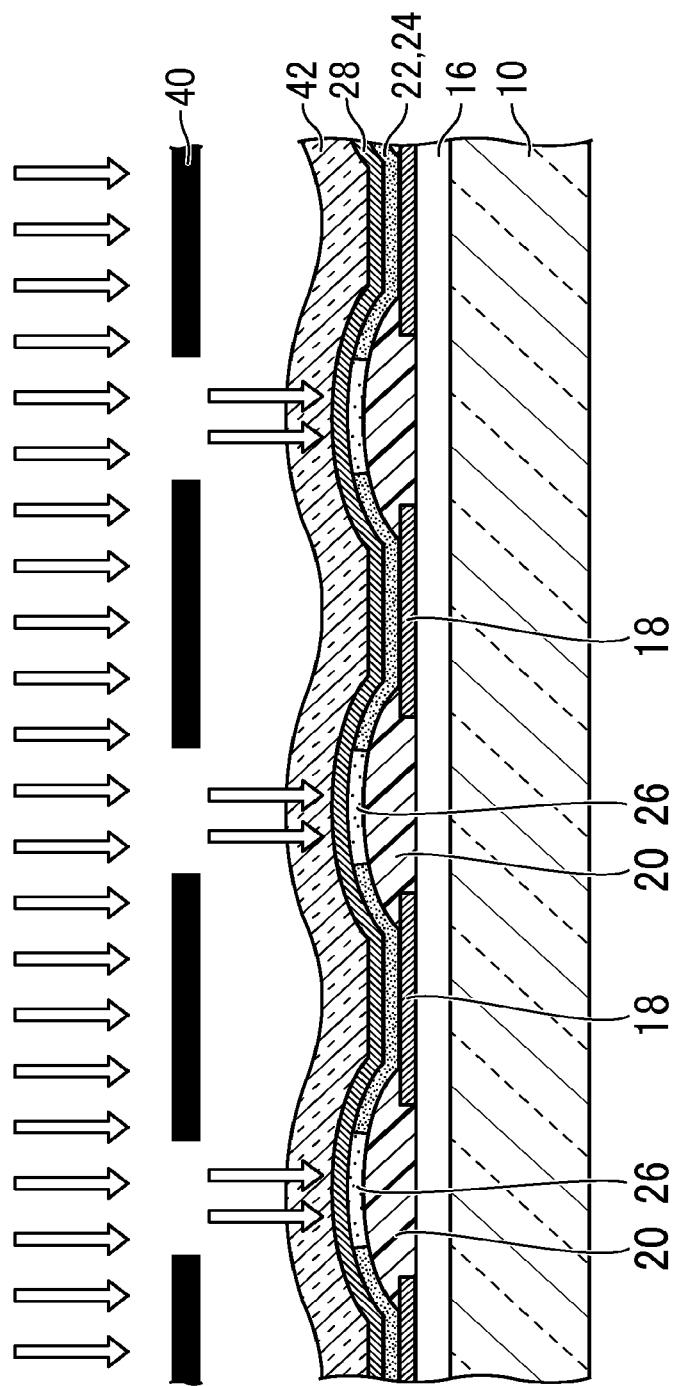
FIG. 5 is a diagram illustrating a method of manufacturing an organic electroluminescent display device according to a modification 2 of the first embodiment.

FIG. 5 is a diagram illustrating a method of manufacturing an organic electroluminescent display device according to a modification 2 of the first embodiment of the present invention. In this example, the sealing film 42 is formed on the common electrode 28. Then, after the sealing film 42 has been formed, the energy ray is allowed to pass through the sealing film 42 and the common electrode 28, and applied to the common layer 24. With this configuration, the sealing film 42 can prevent the incorporation of foreign matter.

Figure 6:
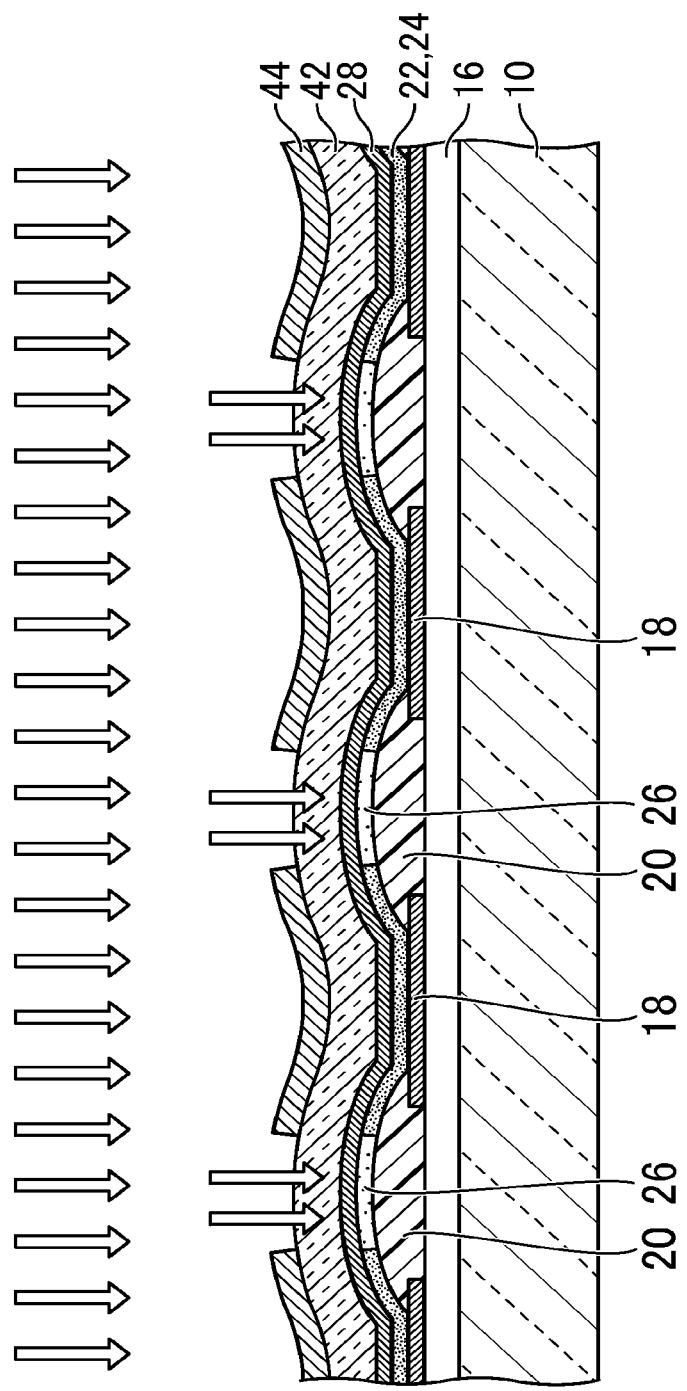
FIG. 6 is a diagram illustrating a method of manufacturing an organic electroluminescent display device according to a modification 3 of the first embodiment.

FIG. 6 is a diagram illustrating a method of manufacturing an organic electroluminescent display device according to a modification 3 of the first embodiment of the present invention. In this example, the sealing film 42 is formed on the common electrode 28, and a mask layer 44 is formed on the sealing film 42 (above the organic electroluminescent film 22). The mask layer 44 is made of, for example, titanium, oxide, and made of a material that prevents the energy ray from passing therethrough. The energy ray is applied through a pattern of the mask layer 44. The pattern of the mask layer 44 prevents the energy ray from passing therethrough above the plural pixel electrodes 18, and allows the energy ray to pass above the areas between the respective adjacent pixel electrodes 18.

Figure 7:
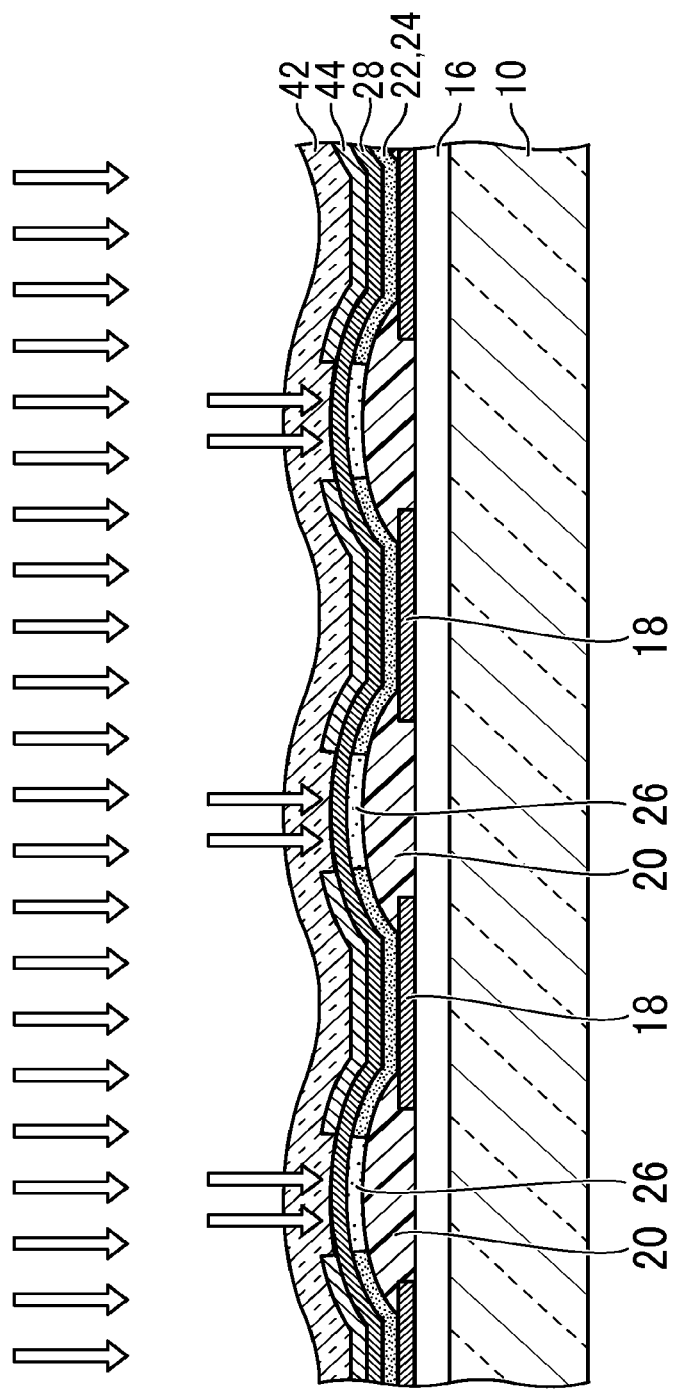
FIG. 7 is a diagram illustrating a method of manufacturing an organic electroluminescent display device according to a modification 4 of the first embodiment.

FIG. 7 is a diagram illustrating a method of manufacturing an organic electroluminescent display device according to a modification 4 of the first embodiment of the present invention. In this example, the mask layer 44 is formed on the common electrode 28 (above the organic electroluminescent film 22), and the sealing film 42 is formed on the mask layer 44. The mask layer 44 is made of, for example, titanium oxide, and prevents the energy ray to pass therethrough. The energy ray is applied, through the sealing film 42 and the mask layer 44. The pattern of the mask layer 44 prevents the energy ray from passing therethrough above the plural pixel electrodes 18, and allows the energy ray to pass therethrough above the areas between the respective adjacent pixel electrodes 18.

Figure 8:
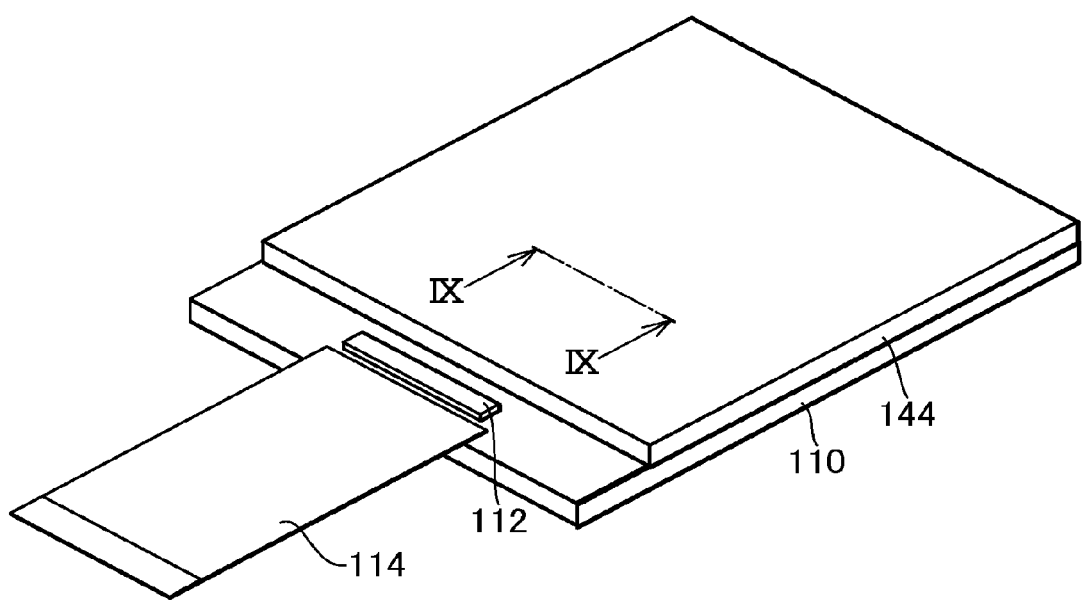
FIG. 8 is a perspective view of an organic electroluminescent display device according to a second embodiment of the present invention.
Figure 9:
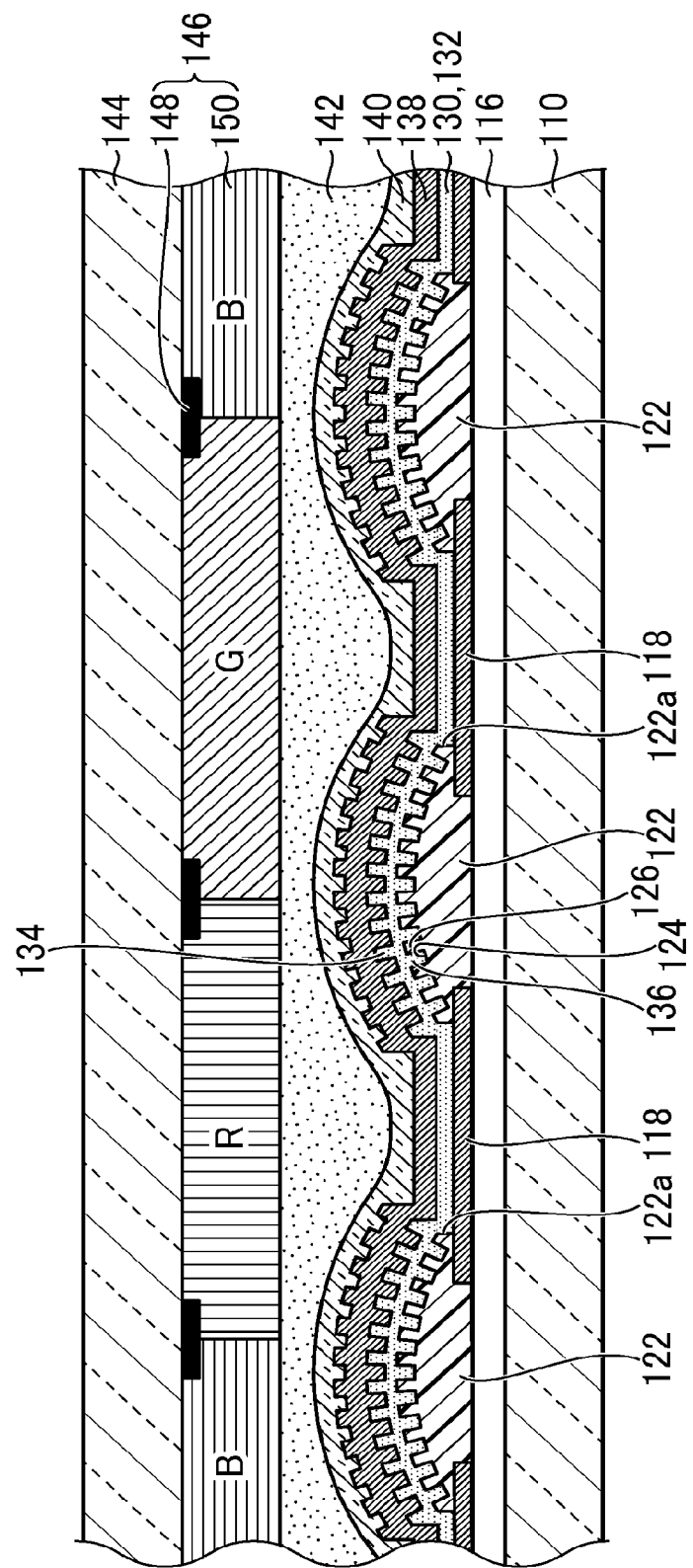
FIG. 9 is a schematic cross-sectional view taken along a line IX-IX of the organic electroluminescent display device illustrated in FIG. 8.

FIG. 8 is a perspective view of an organic electroluminescent display device according to a second embodiment of the present invention. FIG. 9 is a schematic cross-sectional view taken along a line IX-IX of the organic electroluminescent display device illustrated in FIG. 8.

As illustrated in FIG. 8, the organic electroluminescent display device includes a first substrate 110 having an optical transparency made of glass or the like. The first substrate 110 has an image display area for image display. An integrated circuit chip) 112 for driving an element for displaying an image is mounted on the first substrate 110. A flexible wiring substrate 114 is connected to the first substrate 110 for electric connection with an external.

As illustrated in FIG. 9, a circuit layer 116 is disposed on the first substrate 110. The circuit layer 116 includes lines, thin film transistors, an insulating film and the like not shown. Plural pixel electrodes 118 are disposed on the first substrate 110 (on the circuit layer 116 in the example of FIG. 9). The pixel electrodes 118 are anodes.

Figure 10:
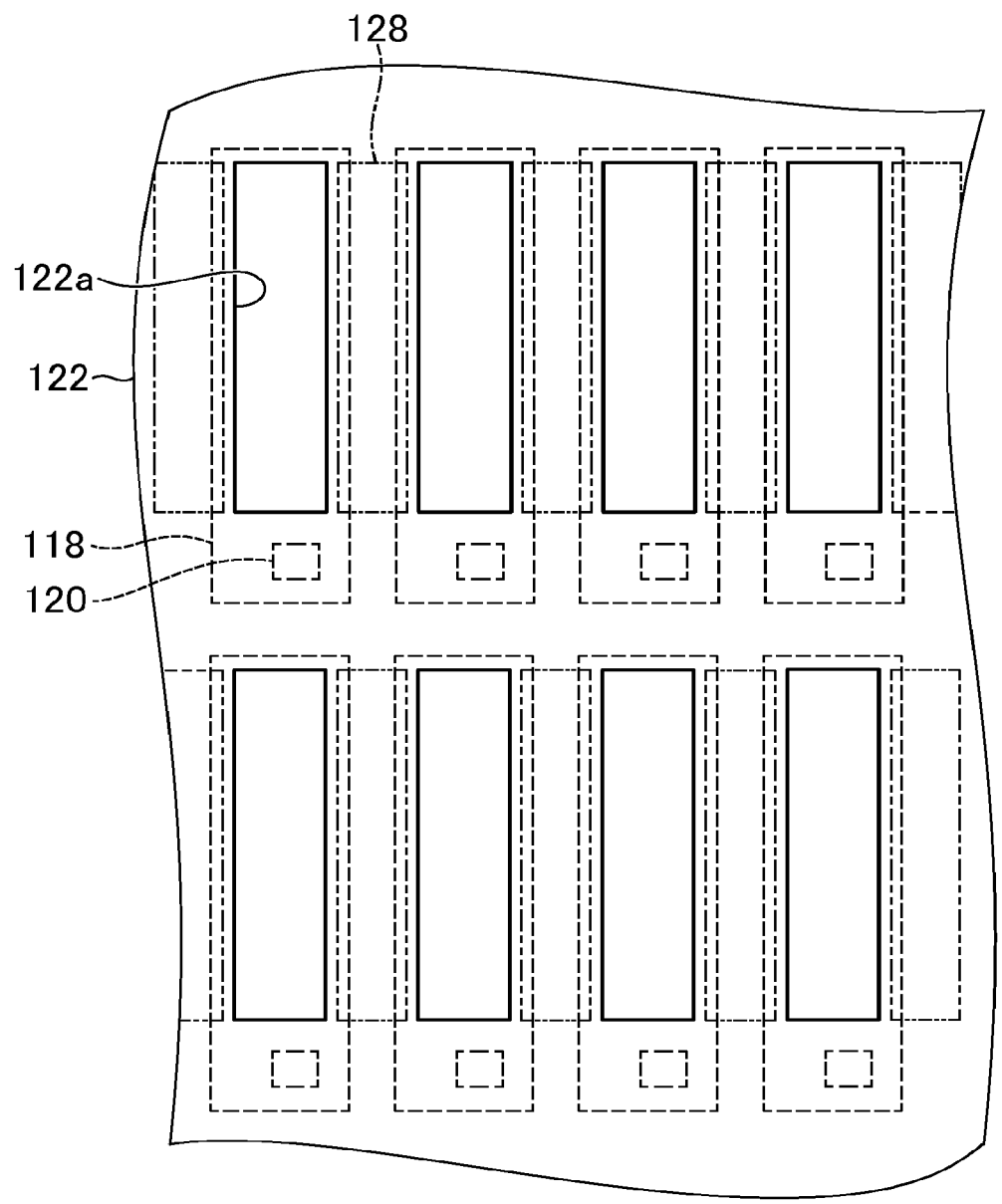
FIG. 10 is a plan view illustrating an array of plural pixel electrodes.

FIG. 10 is a plan view illustrating an array of the plural pixel electrode 118. The plural pixel electrodes 118 are arrayed in a longitudinal direction and a lateral direction. A planar shape of the respective pixel electrodes 118 is elongated in one direction with a long axis and a short axis. In the pixel electrodes 118 adjacent to each other in the longitudinal direction, the respective short sides are adjacent to each other along the short axis. In the pixel electrodes 118 adjacent to each other in the lateral direction, the respective long sides are adjacent to each other along the long axis. The pixel electrodes 118 are electrically connected to lines not shown of the circuit layer 116 by contacts 120.

As illustrated in FIG. 9, an insulating layer 122 is disposed in the areas between the respective adjacent pixel electrodes 118 so as to rest on ends of the respective pixel electrodes 118. The insulating layer 122 is configured to surround the peripheries of the respective pixel electrodes 118. In other words, the insulating layer 122 has openings 122a that expose the center portions of the pixel electrodes 118 (refer to FIG. 10).

The insulating layer 122 has an upper surface with a concavo-convex shape having plural, concave portions 124 and plural, convex portions 126. The concavo-convex shape is formed on a convex curve. Therefore, bottom surfaces of the plural concave portions 124 are arrayed along one convex curve, and upper surfaces of the plural convex portions 126 are arrayed along another convex curve. As illustrated in FIG. 10, the plural concave portions 124 and the plural convex portions 126 of the insulating layer 122 are formed in areas 128 between, the respective adjacent long sides with the avoidance of areas between the respective adjacent short sides.

An organic electroluminescent film. 130 is disposed, over the first substrate 110. The organic electroluminescent film 130 is configured to rest on the plural, pixel electrodes 118 and the insulating layer 122. The organic electroluminescent film 130 is formed of plural layers although not shown, includes at least a light emitting layer, and also includes at least one layer of an electron transport layer, a hole transport layer, an electron injection layer, and a hole injection layer. The light emitting layer is configured to emit only light of one color (for example, white).

The organic electroluminescent film 130 includes a common layer 132 that continuously covers the plural pixel electrodes 118 and the insulating layer 122. In the example of FIG. 9, the overall organic electroluminescent film 130 is formed of the common layer 132. Alternatively, at least one layer (except for at least one layer) of the organic electroluminescent film 130 including the plural layers is the common layer 132 (for example, the electron injection layer), and the remaining layers including at least one layer may be cut for each of the pixel electrodes 118. In the organic electroluminescent film 130 with a tandem structure including two or more light emitting layers, a charge generation layer for supplying electrons and holes which is arranged between the respective adjacent light emitting layers may be configured by the common layer 132.

The common layer 132 includes an upper portion 134 that rests on the respective convex portions 126 of the concavo-convex shape of the insulating layer 122, and a lower portion 136 that rests on the respective concave portions 124 thereof. The upper portion 134 and the lower portion 136 are offset vertically from each other. Parts of the upper portion 134 and the lower portion 136 in the thickness direction thereof are continuous in the lateral direction, but at least parts of the upper portion 134 and the lower portion 136 in the thickness direction thereof are discontinuous from each other in the lateral direction, to thereby form steps. With the formation of the upper portion 134 and the lower portion 136, the thickness of the common layer 132 is partially thinned to increase an electric resistance of the common layer 132.

A common electrode 138 is disposed on the organic electroluminescent film 130. The common electrode 138 is a cathode. A voltage is applied to the pixel electrodes 118 and the common electrode 138 to inject holes and electrons into the organic electroluminescent film 130 from the pixel electrodes 118 and the common electrode 138. The injected holes and electrons are coupled with each other in the light emitting layer to emit light. Since the insulating layer 122 is interposed between the ends of the pixel electrodes 118 and the common electrode 138, the short-circuiting between the pixel electrodes 118 and the common electrode 138 is prevented.

According to this embodiment, the thickness of the common layer 132 is partially thinned above the areas between the respective adjacent pixel electrodes 118 to increase the electric resistance. With this configuration, a current can be prevented from being leaked between the respective adjacent pixels through, the common layer 132.

A sealing film. 140 is disposed on the common, electrode 138. The sealing film 140 seals the organic electroluminescent film 130 so as to block moisture. A filter layer 142 is disposed, on the sealing film 140.

A second substrate 144 is arranged to face the first substrate 110 with a gap. A color filter layer 146 is disposed on a surface of the second substrate 144 on the first substrate 110 side. The color filter layer 146 includes a black matrix 148 and a colored layer 150. Since the light emitting layer (not shown) of the above-mentioned organic electroluminescent film 130 emits a single color (for example, white), the provision of the color filter layer 146 enables full color display in this embodiment. When the organic electroluminescent film 130 includes plural light emitting layers that emit respective different, colors (for example, red, green, and blue), the light emitting layer emits the light of plural colors, thereby making the colored layer 150 unnecessary. The filter layer 142 is disposed between the first substrate 110 and the second substrate 144.

FIGS. 11 to 14 are diagrams illustrating a method of manufacturing the organic electroluminescent display device according to the second, embodiment, of the present invention.

Figure 11:
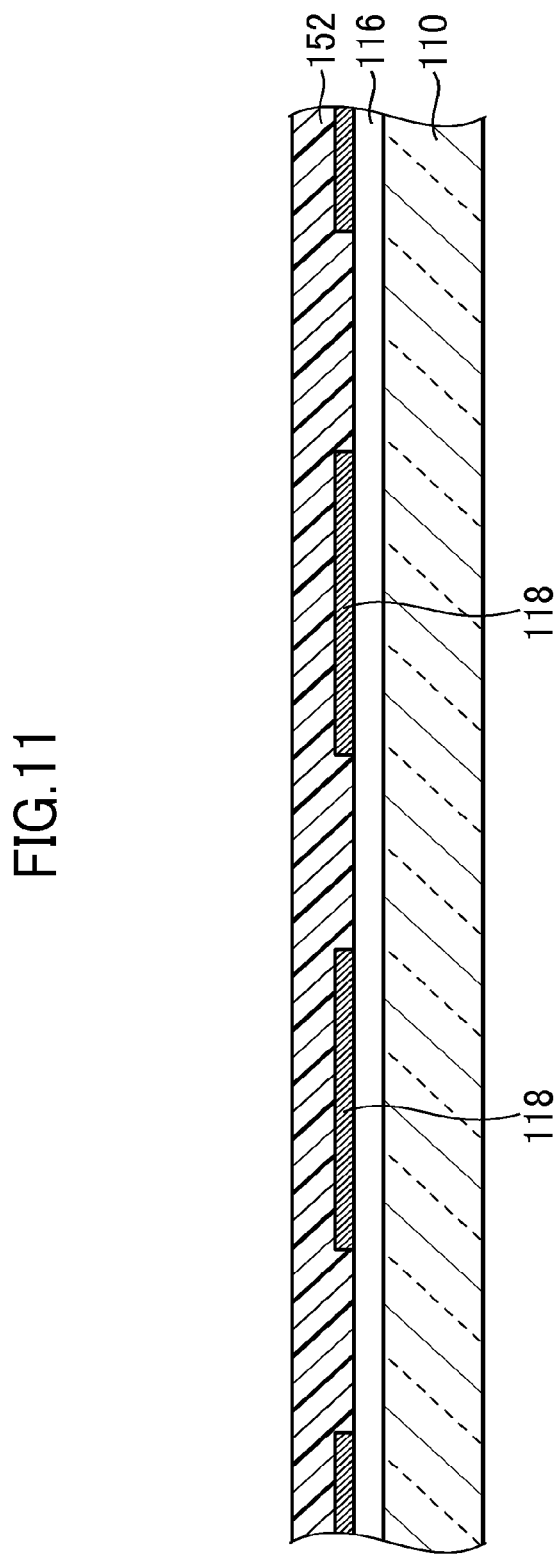
FIG. 11 is a diagram illustrating a method of manufacturing the organic electroluminescent display device according to the second embodiment of the present invention.

As illustrated in FIG. 11, the first substrate 110 on which the plural pixel electrodes 118 are disposed is prepared, and an insulating material 152 is disposed to cover the plural pixel, electrodes 118.

Figure 12:
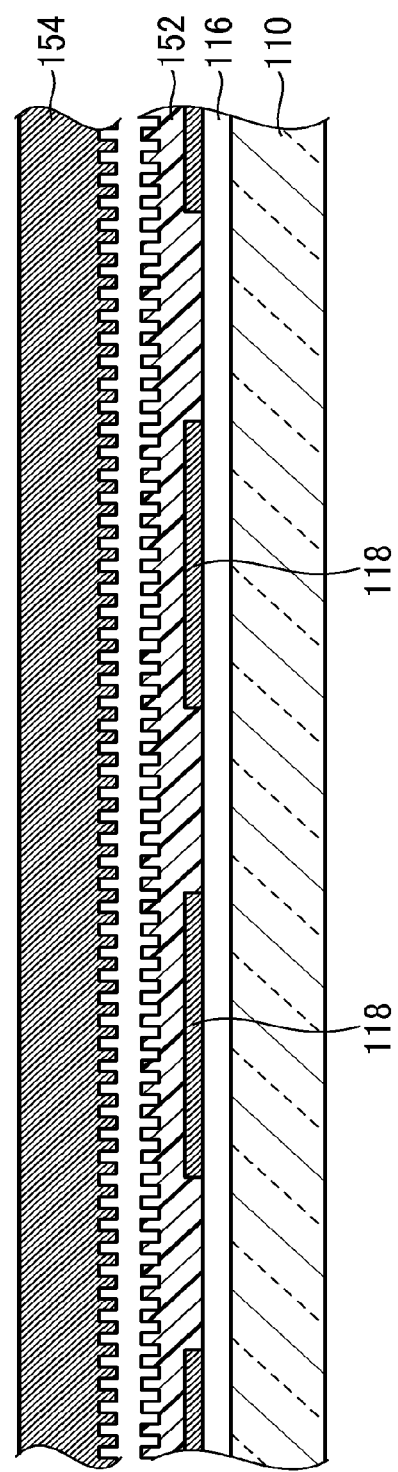
FIG. 12 is a diagram illustrating a method of manufacturing the organic electroluminescent display device according to the second embodiment of the present invention.

As illustrated in FIG. 12, the insulating material 152 is formed into a concavo-convex shape. For example, the concavo-convex shape is given the insulating material 152 by nanoimprint. In detail, a nanostamper 154 having fine irregularities is pushed against the insulating material 152 to transfer a pattern of the nanostamper 154. In thermal nanoimprint, the Insulating material 152 is a thermoplastic resin, and the irregularities of the nanostamper 154 are pressed and transferred to the resin softened by heating to a glass transition temperature or higher.

Figure 13:
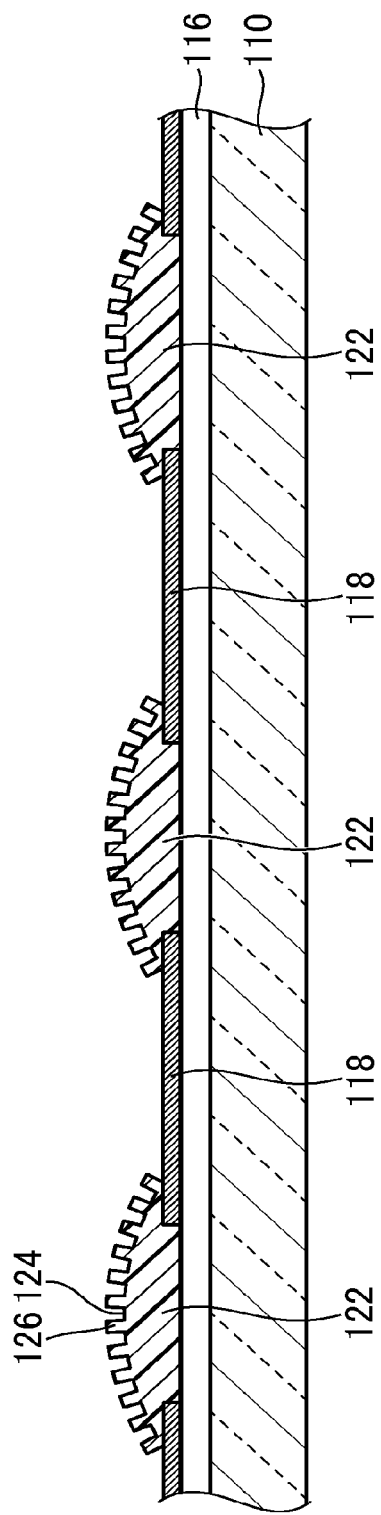
FIG. 13 is a diagram illustrating a method of manufacturing the organic electroluminescent display device according to the second embodiment of the present invention.

As illustrated in FIG. 13, the insulating material 152 is partially removed from above at least a center portion of the respective pixel electrodes 118. The partial removal of the insulating material 152 is conducted by at least one of photolithography and dry etching. With the application of the photolithography, as illustrated in FIG. 13, an upper surface of the remaining insulating material 152 is formed into a convex curve shape. In this way, the insulating layer 122 is formed in the areas between the respective adjacent pixel electrodes 118 so as to rest on the ends of the respective pixel electrodes 118. The insulating layer 122 has the upper surface with the concavo-convex shape having the plural concave portions 124 and the plural convex portions 126.

Figure 14:
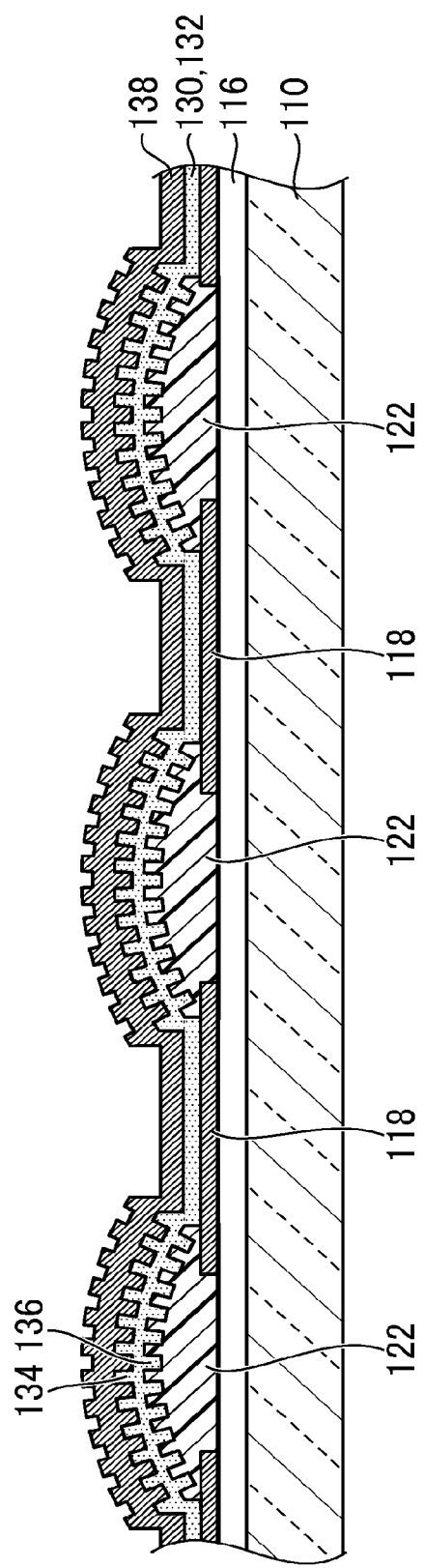
FIG. 14 is a diagram illustrating a method of manufacturing the organic electroluminescent display device according to the second embodiment of the present invention.

As illustrated in FIG. 14, the organic electroluminescent film 130 is formed over the first substrate 110 with the inclusion of the common layer 132 that continuously covers the plural pixel electrodes 118 and the insulating layer 122. Since the organic electroluminescent film 130 is formed by vapor deposition, the organic electroluminescent film 130 is shaped according to an underlying surface shape. In detail, the above-mentioned common layer 132 is formed with the provision of the upper portion 134 resting on the respective plural convex portions 126 of the concavo-convex shape of the insulating layer 122, and the lower portion 136 resting on the respective plural concave portions 124 thereof. The upper portion 134 and the lower portion 136 are offset vertically from each other. At least parts of the upper portion 134 and the lower portion 136 in the thickness direction thereof are discontinuous from each other in the thickness direction. The common electrode 138 is formed on the organic electroluminescent film 130.

According to this embodiment, the thickness of the common layer 132 is partially thinned above the areas between the respective adjacent pixel electrodes 118 to increase the electric resistance. With this configuration, a current can be prevented from being leaked between the respective adjacent pixels through the common layer 132.

Figure 15:
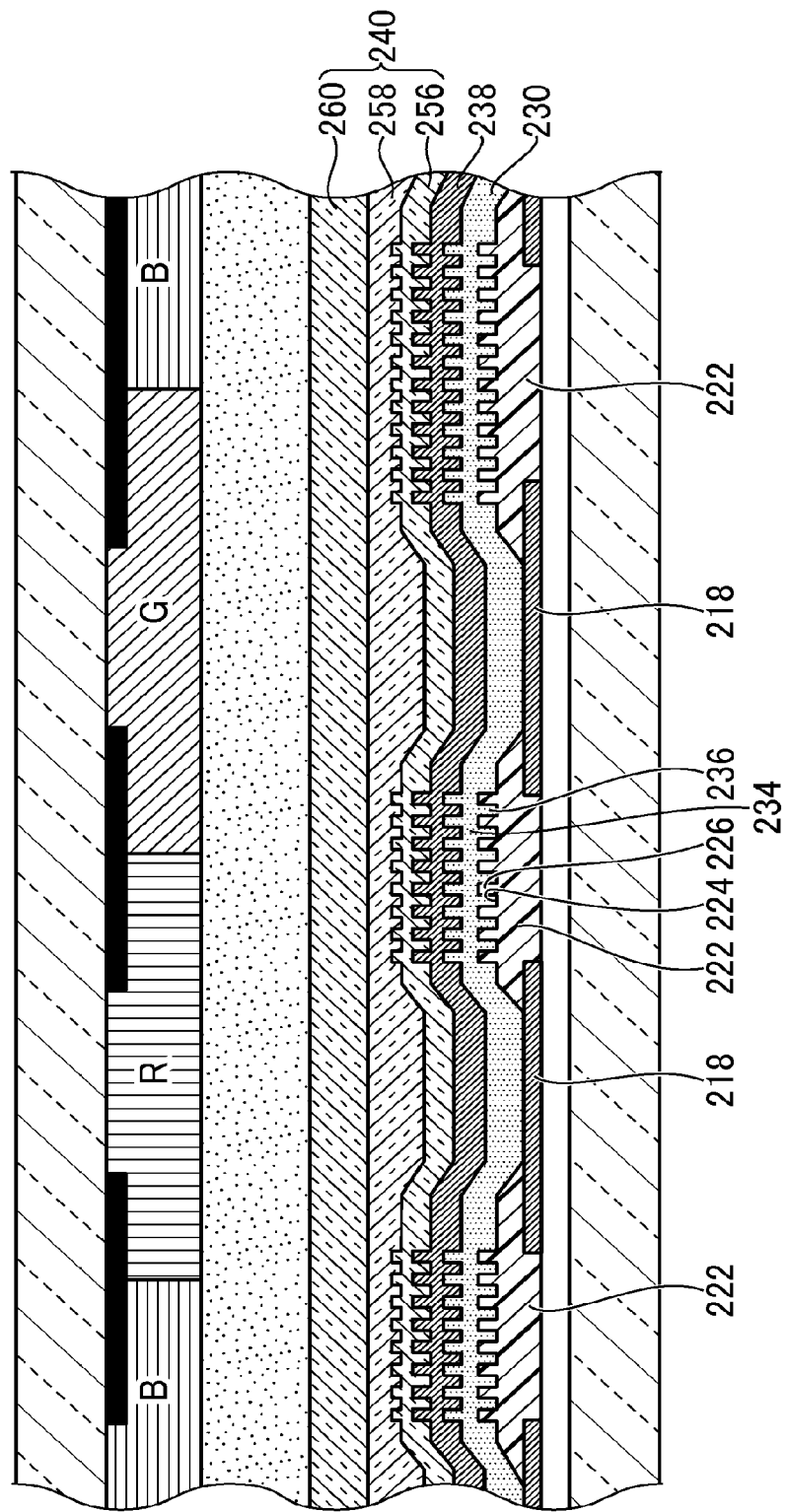
FIG. 15 is a cross-sectional view of an organic electroluminescent display device according to a third embodiment of the present invention.

FIG. 15 is a cross-sectional view of an organic electroluminescent display device according to a third embodiment of the present invention. In this embodiment, a concavo-convex shape of an insulating layer 222 is formed on a plane. That is, bottom surfaces of plural concave portions 224 are arrayed along one plane, and upper surfaces of plural convex portions 226 are arrayed along another plane. Plural sealing films 240 (a first sealing film 256, a second sealing film 258, and a third sealing film 260) are disposed on a common electrode 238. The sealing films 240 seal an organic electroluminescent film 230 to block moisture. The other configurations correspond to the contents described in the above embodiments.

Figure 16:
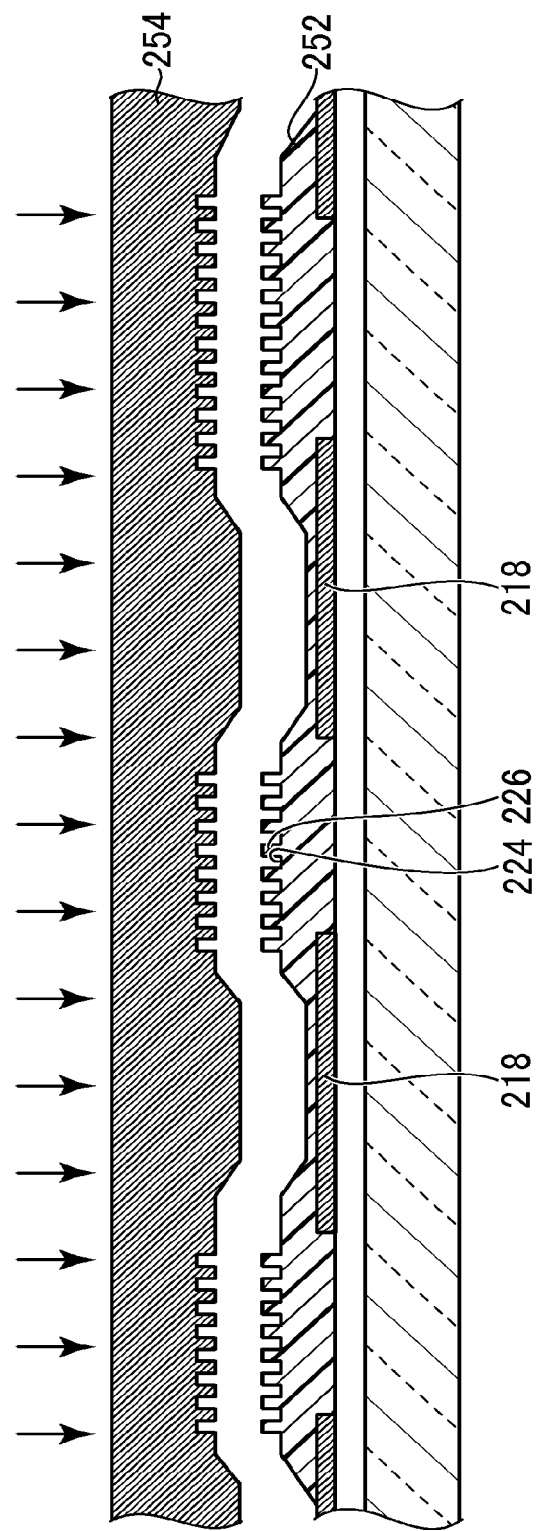
FIG. 16 is a diagram illustrating a method of manufacturing the organic electroluminescent display device according to the third embodiment of the present invention.
Figure 17:
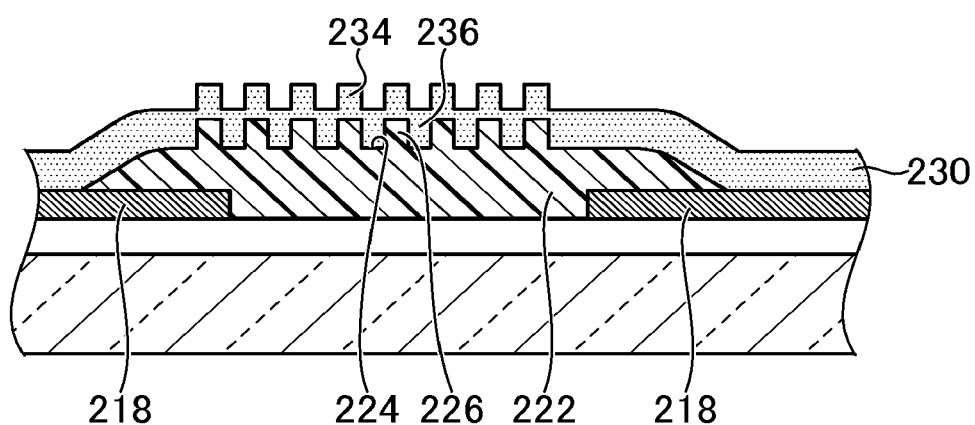
FIG. 17 is a diagram illustrating a method of manufacturing the organic electroluminescent display device according to the third embodiment of the present invention.

FIGS. 16 and 17 are diagrams illustrating a method of manufacturing the organic electroluminescent display device according to the third embodiment of the present invention.

As illustrated in FIG. 16, a concavo-convex shape is given an insulating material 252 formed to cover plural pixel electrodes 218 by nanoimprint. In detail, a nanostamper 254 having fine irregularities is pushed against the insulating material 252 to transfer a pattern of the nanostamper 254. In optical nanoimprint, the insulating material 252 is a photocurable resin, and the irregularities of the nanostamper 254 are pressed and transferred to the resin, and the resin is irradiated with ultraviolet rays, and cured.

Also, the insulating material 252 is recessed and thinned above at least, the center portion of the respective pixel electrodes 218 by nanoprint. In detail, the nanostamper 254 has protrusion areas corresponding to positions at which the insulating material 252 is recessed. The nanostamper 254 has irregularities in the relatively recessed areas.

Then, the insulating material 252 is partially removed from above at least a center portion of the respective pixel electrodes 218 (refer to FIG. 15). The partial removal of the insulating material 252 is conducted by dry etching.

As illustrated in FIG. 17, the organic electroluminescent film 230 is formed. As illustrated in FIG. 15, the common electrode 238 is formed on the organic electroluminescent film 230 to form the plural sealing films 240 (the first sealing film. 256, the second sealing film 258, and the third sealing film 260). The subsequent processes correspond to the contents described in the second embodiment.

Figure 18:
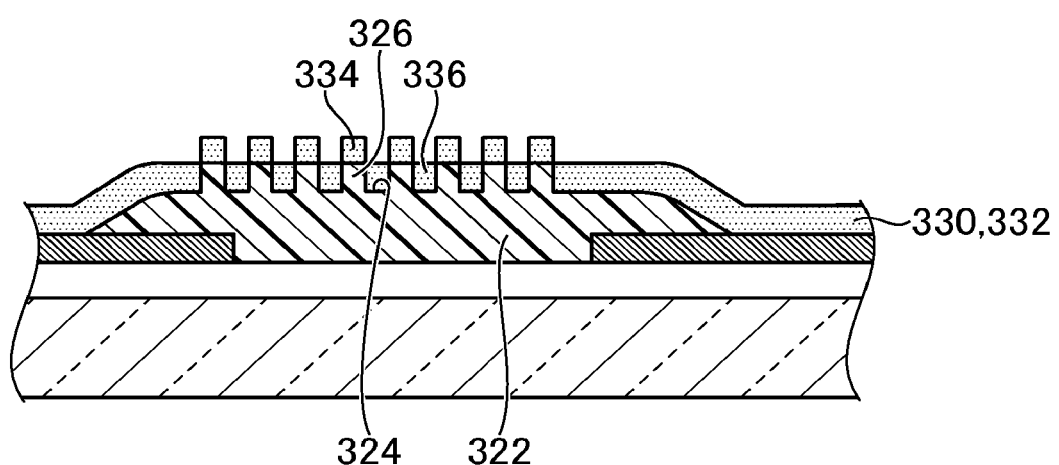
FIG. 18 is a diagram illustrating a modification of the third embodiment.

FIG. 18 is a diagram illustrating a modification of the third embodiment. Also, in this example, a common layer 332 of an organic electroluminescent film 330 has an upper portion 334 that rests on convex portions 326 of an insulating layer 322, and a lower portion 336 that rests on a concave portion 324. However, the upper portion 334 and the lower portion 336 are separated from each other. That is, the upper portion 334 and the lower portion 336 are offset vertically from each other, and the overall portion of the upper portion 334 and the lower portion 336 in the thickness direction is discontinuous from each other. If the common layer 332 is thinly formed, the upper portion 334 and the lower portion 336 are separated from each other.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic electroluminescent display device, comprising:
   a substrate;
   a plurality of pixels on the substrate including a plurality of pixel electrodes on the substrate, respectively;
   an insulating layer separating the pixels from each other and covering an end of each of the pixel electrodes;
   an organic electroluminescent film above the pixel electrodes and the insulating layer, the organic electroluminescent film including a common layer continuously overlapping the pixel electrodes; and
   a common electrode disposed on the organic electroluminescent film and being in physical contact with the common layer,
   wherein the common layer has first portions and second portions which are different from the first portions,
   each of the first portions is located between the pixel electrodes,
   the first portions do not overlap the pixel electrodes, and
   electric conductivity of the first portions is lower than electric conductivity of the second portions.

2. The organic electroluminescent display device according to claim 1, further comprising a sealing film and a mask film which cover the common electrode, wherein
   the first portions do not overlap the mask film, and
   the seconds portions overlap the mask film.

3. The organic electroluminescent display device according to claim 2, wherein the mask film is made of titanium oxide.

4. The organic electroluminescent display device according to claim 2, wherein the mask film is made of a material through which an energy ray does not pass.

5. The organic electroluminescent display device according to claim 2, wherein the mask film is located between the sealing film and the common electrode.

6. The organic electroluminescent display device according to claim 2, wherein the mask film is located on an opposite side of the sealing film from the common electrode.

7. An organic electroluminescent display device, comprising:
   a substrate;
   a plurality of pixels on the substrate including a plurality of pixel electrodes on the substrate, respectively;
   an insulating layer separating the pixels from each other and covering an end of each of the pixel electrodes;
   an organic electroluminescent film above the pixel electrodes and the insulating layer, the organic electroluminescent film including a common layer continuously overlapping the pixel electrodes; and
   a common electrode disposed on the organic electroluminescent film,
   wherein the insulating layer has an upper surface with a concavo-convex shape having a plurality of concave portions and a plurality of convex portions,
   the common layer includes an upper portion overlapping one of the convex portions, and a lower portion overlapping one of the concave portions,
   the common layer has a thin region which is thinner than the upper portion and the lower portion.

8. The organic electroluminescent display device according to claim 7, wherein the common electrode is on and in physical contact with the common layer.

9. The organic electroluminescent display device according to claim 7, wherein the upper portion and the lower portion are offset vertically from each other.

10. The organic electroluminescent display device according to claim 7, wherein electric resistance of the thin region is higher than electric resistance of the upper portion and electric resistance of the lower portion.

11. The organic electroluminescent display device according to claim 7, wherein the upper portion and the lower portion are separated from each other.

12. The organic electroluminescent display device according to claim 7, wherein bottom surfaces of the plurality of concave portions are arrayed along one plane, and
upper surfaces of the plurality of convex portions are arrayed along another plane.

13. The organic electroluminescent display device according to claim 7, wherein bottom surfaces of the plurality of concave portions are arrayed along one convex curve, and
upper surfaces of the plurality of convex portions are arrayed along another convex curve.

14. The organic electroluminescent display device according to claim 7, wherein the thin region is located between the upper portion and the lower portion.

\* \* \* \* \*